United States Patent [19]

Aslan

[11] 4,023,093
[45] May 10, 1977

[54] MAGNETIC FIELD RADIATION DETECTOR

[75] Inventor: Edward E. Aslan, Plainview, N.Y.

[73] Assignee: The Narda Microwave Corporation, Plainview, N.Y.

[22] Filed: Oct. 20, 1975

[21] Appl. No.: 623,962

[52] U.S. Cl. .............................. 324/43 R; 324/95
[51] Int. Cl.² ...................................... G01R 33/02
[58] Field of Search ........................... 324/43 R, 95

[56] References Cited

UNITED STATES PATENTS

| 3,721,900 | 3/1973 | Andrews | 324/95 |
| 3,750,017 | 7/1973 | Bowman et al. | 324/43 R |
| 3,794,914 | 2/1974 | Aslan | 324/95 |

FOREIGN PATENTS OR APPLICATIONS

| 1,002,010 | 3/1952 | France | 324/43 R |
| 1,009,936 | 6/1952 | France | 324/43 R |

OTHER PUBLICATIONS

F. Tischer, Precision Sensor for Magnetic Field, IEEE Trans. Ind. Elec., Cont Instrument (U.S.A.), vol. 17, No. 2, Apr. 1970, pp. 185-187.

Aslan, E., Broad Band Isotropic etc., IEEE Trans. on Inst., vol. 1m-21, No. 4, Nov. 1972, pp. 421-424.

Primary Examiner—Robert J. Corcoran
Attorney, Agent, or Firm—Eisenman, Allsopp & Strack

[57] ABSTRACT

This is a probe for detecting the magnetic field component of low frequency electro-magnetic fields. Loop antennas utilizing thermocouples are tuned to resonate at a frequency below the lower frequency of the range being detected and a plurality of these loop antennas are arranged orthogonally to one another in order to obtain isotropic performance.

8 Claims, 3 Drawing Figures

MAGNETIC FIELD RADIATION DETECTOR

BACKGROUND OF THE INVENTION

1. Field of the Invention

This invention relates to monitoring of low frequency magnetic fields within the range of 10 MHz to 300 MHz. More particularly, it relates to a portable probe system for measuring the "H" field.

Microwave energy is finding employment in ever increasing areas, both consumer and industrial. This expanding use has brought into question the effect upon the environment of such energy, and it is important to accurately and reliably detect the extent to which such energy is dissipated. The monitoring of interest, relative to this invention, is the intensity of magnetic field radiation within a particular space or area, without limitation to the polarization of the field in question.

DESCRIPTION OF THE PRIOR ART

The National Bureau of Standards has been concerned with the monitoring of magnetic fields and a number of magnetic field probes have been developed for this purpose. Unfortunately near-field measurements are often distorted by the measuring instruments and special precautions and corrections are required to compensate for the ensuing errors. It has been recognized that it is desirable to detect fields within the frequency range of 10 MHz to 300 MHz. It has also been recognized that such detection should ideally be isotropic and should be of flat response over the entire measurement range.

It is commonly understood that a loop antenna is responsive to the magnetic field. Instruments have been described both by the National Bureau of Standards and in the patent literature, for example, U.S. Pat. No. 3,721,900 for utilizing such loop antennas. The cited patent also illustrates the utilization of orthogonally disposed coils in order to obtain isotropic measurements.

The fact that non-polarization dependent performance can be obtained by orthogonal disposition of the antenna elements has also been disclosed in U.S. Pat. No. 3,794,914, granted to the assignee of this invention on Feb. 26, 1974. This patent describes a probe responsive to the electric field component of an electro-magnetic field and illustrates the utilization of thin film thermocouple elements for converting radio frequency induced currents into a direct current voltage for driving metering equipment. In contrast, the present invention is designed for response to the magnetic component of electro-magnetic fields.

SUMMARY OF THE INVENTION

The present invention relates to a magnetic field monitoring probe system using orthogonically disposed loop antennas terminated in thermocouples.

An object of the invention is to provide an improved low frequency magnetic field detector.

Another object of the invention is to provide an improved low frequency radiation detector that is principally responsive to the magnetic component of an electro-magnetic field.

Another object of the invention is to provide a low frequency magnetic radiation detector that has a substantially flat response within the range of 10 MHz to 300 MHz.

In accordance with the invention, there is provided a portable probe assembly utilizing three orthogonally disposed coils, each terminated in a thermocouple. The coils are tuned to a resonant frequency somewhat below the low frequency end of the detection band. These coils are selectively mounted upon a probe and are interconnected via high resistance monolithic leads through the probe to metering instrumentation in order to provide a visual indication of the field strength detected.

A more thorough understanding of the invention, along with a better appreciation of the objects and novel features thereof, will be available from the following description and the attached drawings.

DESCRIPTION OF THE PREFERRED EMBODIMENT

Figure 1:
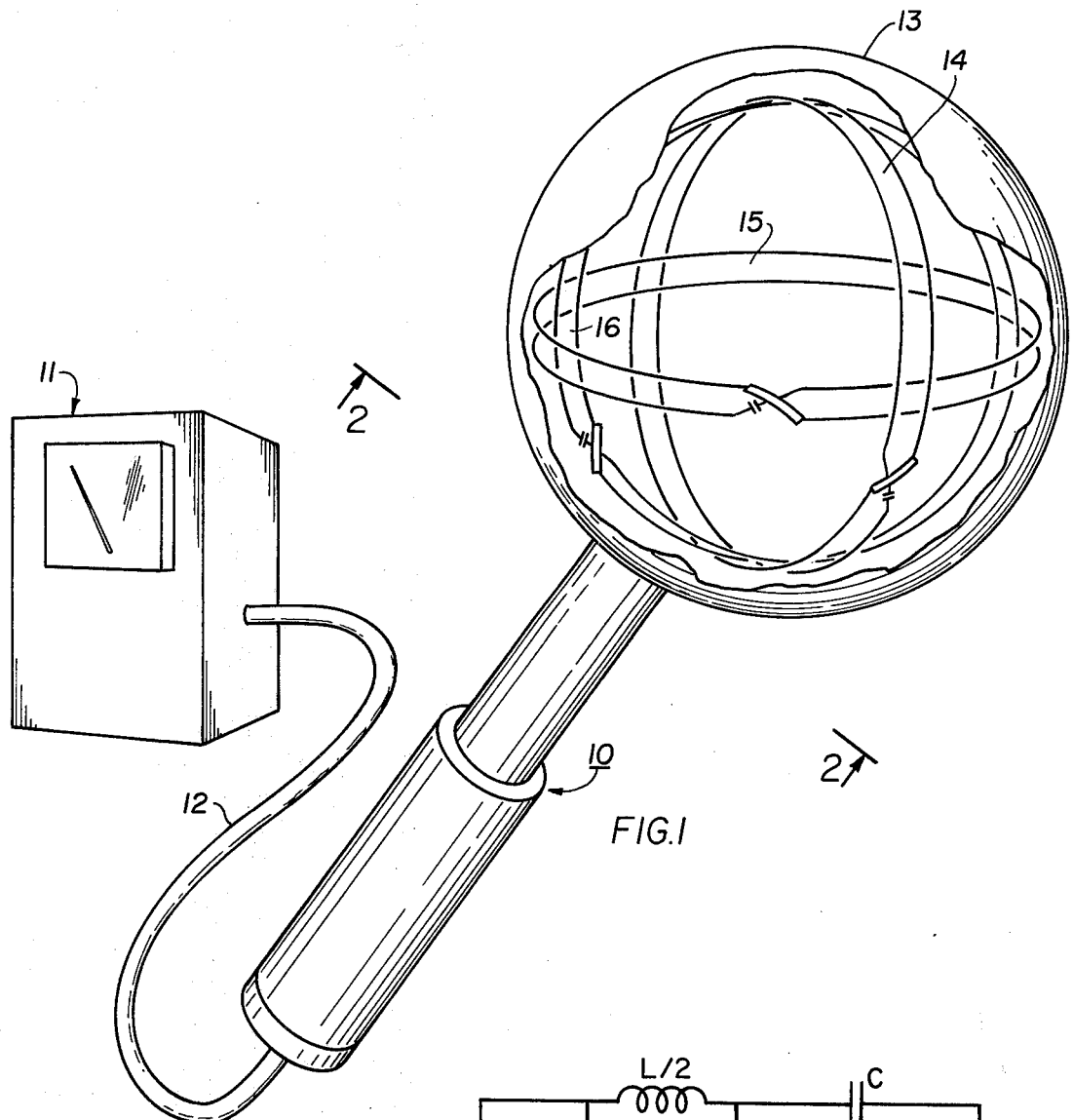
FIG. 1 is a pictorial illustration of a magnetic field detection system incorporating the present invention.

FIG. 1, the basic portable probe 10 is designed for convenient, hand-held use. A particular unit is approximately one foot in length and the spherical detection portion 13 has a diameter of less than 4 inches. As schematically shown in the break-away portion of the drawing, detection loops 14, 15, 16 are orthogonally mounted within sphere 13. The loops are covered by a thin film very high resistivity coating as a shield against electro-static charges. In a particular embodiment, the resistivity of this film was in the order of 0.5 megohm per square.

The voltage developed by the thermocouples within the detection loops is applied to a pre-amplifier (not shown) that is mounted directly within the handle of the probe. The specific components of this pre-amplifier are not germane to the invention; however, it is important that it be an extremely low noise operational amplifier with a minimum of zero offset characteristic. The gain of the amplifier establishes the calibration of the probe.

A multi-conductor, shielded cable 12 connects the probe to an indicating meter 11. Here too, the particular meter components are not important. It is simply necessary that this meter provide a visual or audible output indicative of the field being measured. This output takes into account the face that the radio frequency induced currents in the loops of the detector, will heat the terminating resistive thermocouple hot junctions and thereby provide a direct current output voltage which is proportional to the square of the radio frequency induced current. The shielded cable 12 carries the pre-amplifier output to the meter and also carries the power supply voltages and the correction voltage to the probe. The correction voltage is applied to the input of the amplifier, as required, to compensate for zero offset.

Figure 2:
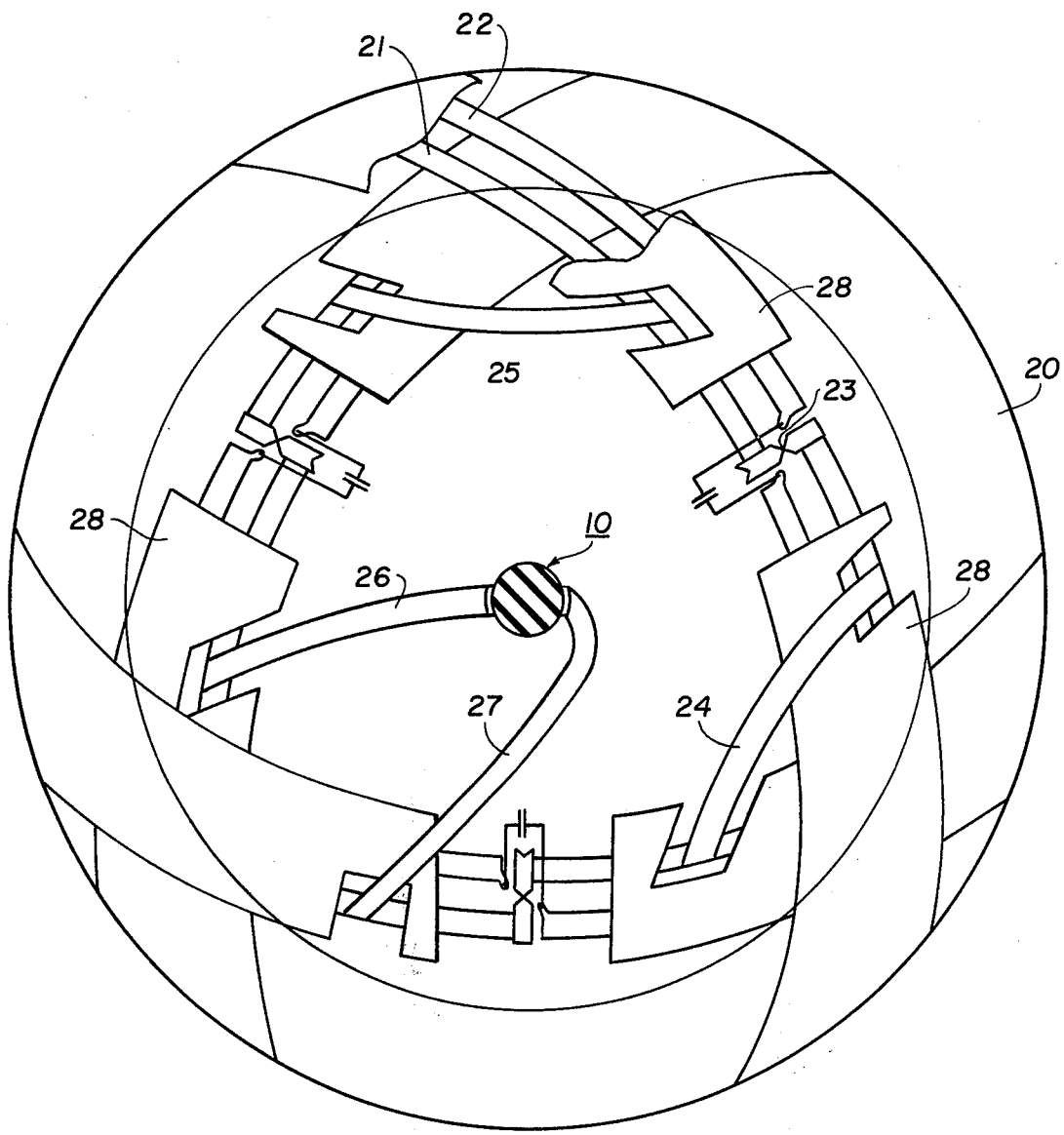
FIG. 2 is a cross-sectional view along the lines 2—2 shown in FIG. 1, revealing the structural arrangement of the coils and thermocouples used in a particular embodiment of the invention.

FIG. 2 reveals the structure and arrangement of components within the detection sphere. The entire sphere is enclosed within the thin resistive film 20 mentioned above. Each loop is made up of two coils, e.g. 21, 22, having a thin film thermocouple element serially connected at one end thereof. The remote ends of each coil of the pair, are bridged by a capacitor for tuning the coil to a resonant frequency below the low frequency of the band to be detected. In a particular embodiment, operative with a substantially flat response from 10 mHz to 200 MHz, the coils 21, 22 had a diameter of approximately 9 cm. They were terminated with thin film thermocouple elements formed of antimony and bismuth, deposited between silver terminals, having a resistance of 30 to 50 ohms. Each loop had an inductance of $0.73\mu h$ and series capacitors of $820\mu\mu fd$ resonated them at about 6.5 MHz. It is a principal aspect of the invention that the impedance of the loop at the low frequency end of the band, be equal to the inductive reactance of the loop at the low frequency end of the band. In order to achieve this condition, the series capacitor is chosen in order to add capacitative reactance that will lower the total reactance relative to the resistive component. In other words, the capacitor is added in order to tune the loop to a resonant frequency below the lower end of the band.

The loops are orthogonally disposed relative to one another and they are serially interconnected by means of high resistive film leads 24, 25. Similar high resistive film leads 26, 27 interconnect the loops to the pre-amp.

The resistive leads should be monolithic and substantially rigid. this assures that the leads will not cause modulation of the signal due to flexing or other movement. Insulating tape 28, or the like, may be used to isolate the various connections from one another.

Figure 3:
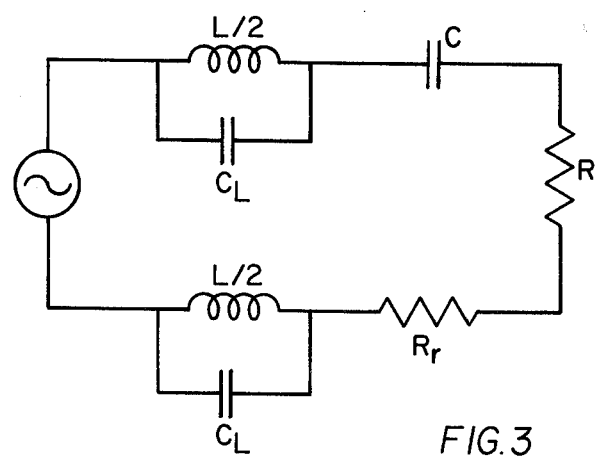
FIG. 3 is a lumped equivalent circuit of a coil used in the detection probe in a particular embodiment of the invention.

FIG. 3 shows the lumped circuit diagram of an individual loop. In this diagram C is the lumped resonating capacitor, L/2 is the inductance of each turn and $C_L$ is the loop capacitance of each turn. $R_r$ is the radiation resistance. R is the resistance of the thin film thermocouple element. Both the loop capacitance and radiation resistance are extremely small and are found to be negligible in the operating band. The input voltage is the induced equivalent open circuit voltage.

By using the teachings disclosed above, low frequency magnetic field detection monitors have been developed covering the range of 10 MHz to 300 MHz. These monitors have a 1 db band width over the measurement range. Clearly, those skilled in the art may vary parameters and certain structural details in accordance with desired design criteria. Nevertheless, all variations and modifications coming within the scope of this invention are intended to be covered by the following claims.

What is claimed is:

1. A magnetic field radiation detector for measuring the intensity of a magnetic field within a predetermined frequency range, comprising a plurality of loop antennas each connected to a thermocouple positioned substantially within the periphery thereof, means for tuning said loop antennas to a resonant frequency below the lower end of said range, and high resistance leads interconnecting said thermocouples in series.

2. A magnetic field radiation detector as defined in claim 1, wherein said tuning means adjusts the total impedance of each of said loop antennas to approximately equal the inductive reactance of each of said loop antennas at the low frequency end of said range.

3. A magnetic field radiation detector as defined in claim 1, wherein said loop antennas are orthogonally disposed relative to each other.

4. A magnetic field radiation detector as defined in claim 1, wherein each loop antenna at least two coils with said thermocouple serially connected therebetween.

5. A magnetic field radiation detector as defined in claim 4, wherein each said tuning means comprises a capacitor connected across the ends of each said loop antenna.

6. A magnetic field radiation detector as defined in claim 1, including at least three loop antennas orthogonally disposed relative to each other, means for mounting said loop antennas at the end of an elongated probe, a pre-amplifier within said probe, and further high resistance leads connecting the serially interconnected loop antennas to said pre-amplifier.

7. A magnetic field radiation detector as defined in claim 6, wherein said loop antennas define a sphere that is enclosed by a high resistance shield.

8. A magnetic field radiation detector as defined in claim 6, wherein said high resistance leads are rigid and monolithic.

* * * * *

UNITED STATES PATENT OFFICE
CERTIFICATE OF CORRECTION

Patent No. 4,023,093  Dated May 10, 1977

Inventor(s) Edward E. Aslan

It is certified that error appears in the above-identified patent and that said Letters Patent are hereby corrected as shown below:

| | |
|---|---|
| Column 2, line 29 | Before "FIG. 1" insert --In--, |
| line 54 | Change "face" to --fact--. |
| Column 3, line 28 | Change "this" to --This-- |
| Column 4, line 25 | After "antenna" insert --comprises-- |

Signed and Sealed this twelfth Day of July 1977

[SEAL]

Attest:

RUTH C. MASON
*Attesting Officer*

C. MARSHALL DANN
*Commissioner of Patents and Trademarks*